United States Patent
Lei et al.

(10) Patent No.: US 10,017,422 B1
(45) Date of Patent: Jul. 10, 2018

(54) REGULATOR FOR REGULATING FREQUENCY-TEMPERATURE CHARACTERISTICS OF MICROWAVE DIELECTRIC CERAMICS AND LOW TEMPERATURE CO-FIRED CERAMIC MATERIAL COMPRISING THE SAME

(71) Applicant: Huazhong University of Science and Technology, Wuhan (CN)

(72) Inventors: Wen Lei, Wuhan (CN); Zhengyu Zou, Wuhan (CN); Wenzhong Lv, Wuhan (CN); Xiaoqiang Song, Wuhan (CN); Zehao Chen, Wuhan (CN); Xiaohong Wang, Wuhan (CN); Guifen Fan, Wuhan (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 0 days.

(21) Appl. No.: 15/599,410

(22) Filed: May 18, 2017

(30) Foreign Application Priority Data

Mar. 15, 2017 (CN) .......................... 2017 1 0152015

(51) Int. Cl.
*C04B 35/16* (2006.01)
*C04B 35/195* (2006.01)
(52) U.S. Cl.
CPC ............ *C04B 35/16* (2013.01); *C04B 35/195* (2013.01)

(58) Field of Classification Search
CPC .............................. C04B 35/16; C04B 35/195
See application file for complete search history.

(56) References Cited

U.S. PATENT DOCUMENTS

| 8,603,625 B2* | 12/2013 | Izumi | C04B 35/16 |
| | | | 428/329 |
| 9,073,789 B2* | 7/2015 | Izumi | C04B 35/16 |
| 2011/0117360 A1* | 5/2011 | Izumi | C04B 35/16 |
| | | | 428/329 |
| 2014/0021662 A1* | 1/2014 | Izumi | C04B 35/16 |
| | | | 264/681 |

FOREIGN PATENT DOCUMENTS

JP 2004203646 A * 7/2004

* cited by examiner

*Primary Examiner* — Karl E Group
(74) *Attorney, Agent, or Firm* — Matthias Scholl, PC; Matthias Scholl

(57) ABSTRACT

A microwave dielectric ceramic, including a main crystal phase having a chemical formula of $BaSi_xO_{2x+1}$, where $1.56 \leq x \leq 1.85$. A regulator for regulating frequency-temperature characteristics of microwave dielectric ceramics is also provided. The dielectric constant of the microwave dielectric ceramic is smaller than 8, the temperature coefficient of resonate frequency of the microwave dielectric ceramic is positive, and the microwave dielectric ceramic is anti-reductive. A low temperature co-fired ceramic material includes a main crystal phase, the regulator, and a sintering additive. The main crystal phase of the low temperature co-fired ceramic material includes barium, aluminum, silicon, and oxygen.

15 Claims, No Drawings

REGULATOR FOR REGULATING FREQUENCY-TEMPERATURE CHARACTERISTICS OF MICROWAVE DIELECTRIC CERAMICS AND LOW TEMPERATURE CO-FIRED CERAMIC MATERIAL COMPRISING THE SAME

CROSS-REFERENCE TO RELATED APPLICATIONS

Pursuant to 35 U.S.C. § 119 and the Paris Convention Treaty, this application claims the benefit of Chinese Patent Application No. 201710152015.3 filed Mar. 15, 2017, the contents of which are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND OF THE INVENTION

Field of the Invention

The invention relates to a regulator for regulating frequency-temperature characteristics of microwave dielectric ceramics and a low temperature co-fired ceramic (LTCC) comprising the same. As used in this context, the term "low temperature" refers to a sintering temperature of below 950° C.

Description of the Related Art

Microwave dielectric ceramics are ceramic materials used as dielectric material in a microwave circuit (with a frequency band of between 300 MHz and 30 GHz). In general, low-permittivity microwave dielectric ceramics have negative temperature coefficient ($\tau f$) of resonant frequency. Accordingly, to ensure temperature stability of the material, a Ti-based material having a positive $\tau f$ value, must be added. However, oxygen vacancies are easily produced in the reducing atmosphere, and to maintain the valence balance, Ti4+ tends to acquire weak bound electrons, leading to oriented migration of charge carriers, the semiconducting of the material, and the reduction of insulation resistance and stability of ceramic capacitors made thereof.

SUMMARY OF THE INVENTION

In view of the above-described problems, it is one objective of the invention to provide a regulator for regulating frequency-temperature characteristics of microwave dielectric ceramics and an LTCC material comprising the same. The prepared microwave dielectric ceramic material possesses low dielectric constant, near-zero temperature coefficient of resonate frequency, and excellent anti-reductive property.

To achieve the above objective, in accordance with one embodiment of the invention, there is provided a microwave dielectric ceramic. The microwave dielectric ceramic comprises a main crystal phase having a chemical formula of $BaSi_xO_{2x+1}$, $1.56 \leq x \leq 1.85$.

In a class of this embodiment, the microwave dielectric ceramic has a dielectric constant of smaller than 8 and a positive temperature coefficient of resonate frequency; and the microwave dielectric ceramic has anti-reductive property.

In a class of this embodiment, the dielectric constant of the microwave dielectric ceramic is between 7.1 and 7.9.

In accordance with another embodiment of the invention, there is provided a regulator for regulating frequency-temperature characteristics of microwave dielectric ceramics. The regulator comprises a microwave dielectric ceramic. The microwave dielectric ceramic comprises a main crystal phase having a chemical formula of $BaSi_xO_{2x+1}$, $1.56 \leq x \leq 1.85$. A dielectric constant of the microwave dielectric ceramic is smaller than 8, a temperature coefficient of resonate frequency of the microwave dielectric ceramic is positive, and the microwave dielectric ceramic possesses anti-reductive property.

In a class of this embodiment, the dielectric constant of the microwave dielectric ceramic is between 7.1 and 7.9.

In accordance with still another embodiment of the invention, there is provided a method for preparing a microwave dielectric ceramic material by using the regulator.

In a class of this embodiment, the regulator is used to regulate the temperature coefficient of resonate frequency of the microwave dielectric material from a negative value to a positive value.

In a class of this embodiment, the temperature coefficient of resonate frequency is regulated to be between −10 and +10 ppm/° C.

In a class of this embodiment, the dielectric constant of the microwave dielectric ceramic is between 7.1 and 7.9.

In accordance with still another embodiment of the invention, there is provided a LTCC material. The LTCC material comprises: a main crystal phase of the LTCC material, the regulator, and a sintering additive. The main crystal phase of the LTCC material comprises: barium, aluminum, silicon, and oxygen. A content of the sintering additive is between 0.5 and 2 percent by weight.

In a class of this embodiment, the main crystal phase of the LTCC material is $BaAl_2Si_2O_8$.

In a class of this embodiment, the sintering additive is LiF.

In a class of this embodiment, the content of the sintering additive is 1 percent by weight.

In a class of this embodiment, a chemical formula of the LTCC material is y wt. % $BaAl_2Si_2O_8$+(99−y) wt. % $BaSi_xO_{1+2}$, +1 wt. % LiF, in which $1.56 \leq x \leq 1.85$, $0 \leq y \leq 99$.

In a class of this embodiment, the dielectric constant of the microwave dielectric ceramic is between 7.1 and 7.9.

In accordance with still another embodiment of the invention, there is provided a method for preparing an LTCC microwave ceramic material. The method comprises:

1) weighing and mixing $BaCO_3$, $Al_2O_3$, $SiO_2$ according to a stoichiometry ratio of the chemical formula of $BaAl_2Si_2O_8$ to yield a mixture, performing wet ball-milling on the mixture to yield a slurry, drying the slurry, and calcining a dried product at a temperature of between 1100 and 1200° C. for between 2 and 4 hrs to yield a calcined ceramic powder; and 2) mixing the calcined ceramic powder obtained from 1), the regulator of claim 4, and a sintering additive according to a weight ratio of y: (99−y): 1, in which $0 \leq y \leq 99$, to yield a mixture; performing wet ball-milling on the mixture to yield a slurry, drying the slurry, adding an adhesive to a dried product, granulating, tabletting the dried product to form green samples; sintering the green samples at between 750° C. and 950° C. to yield a low temperature co-fired ceramic microwave ceramic material.

The regulator for regulating frequency-temperature characteristics of the microwave dielectric ceramic has a dielectric constant smaller than 8, a positive temperature coefficient of resonate frequency, and anti-reductive property.

In a class of this embodiment, the sintering additive is LiF.

In a class of this embodiment, the deionized water is used as a dispersant in wet ball-milling processes of 1) and 2).

In a class of this embodiment, the dielectric constant of the microwave dielectric ceramic is between 7.1 and 7.9.

Advantages of the regulator for regulating frequency-temperature characteristics of the microwave dielectric ceramic and the low temperature co-fired ceramic material comprising the same according to embodiments of the invention are summarized as follows:

1) The regulator for regulating the frequency-temperature characteristics of a microwave dielectric ceramic has positive $\tau_f$ value, and is applicable to regulate the temperature coefficient of resonate frequency of most microwave dielectric ceramic to near zero.
2) The conventional regulators for the frequency-temperature characteristic, such as $TiO_2$, $CaTiO_3$, and $SrTiO_3$, are all positive Ti-based materials which easily acquires weak bound electrons and leads to semi-conduction of the device in the reducing atmosphere due to the variable valence of $Ti^{4+}$. The regulator is able to maintain stable phase structure and excellent microwave dielectric performance (anti-reductive property) and is applicable to BME-MLCC.
3) By regulating the temperature coefficient of resonate frequency of the microwave dielectric ceramic material using the regulator, an LTCC material and a preparation method thereof are provided. The LTCC material possesses low dielectric constant, approaching zero temperature coefficient of resonate frequency $\tau_f$, excellent microwave dielectric performance, and sintering temperature as low as 750° C. The preparation of the LTCC material is simple and pollution-free.

DETAILED DESCRIPTION OF THE EMBODIMENTS

For further illustrating the invention, experiments detailing a regulator for regulating frequency-temperature characteristics of microwave dielectric ceramics and a low temperature co-fired ceramic material comprising the same are described below. It should be noted that the following examples are intended to describe and not to limit the invention.

A microwave dielectric ceramic comprises a main crystal phase. The main crystal phase is represented by $BaSi_xO_{2x+1}$, in which $1.56 \leq x \leq 1.85$, and possesses a low dielectric constant and a positive temperature coefficient of resonate frequency, in which the dielectric constant is smaller than 8, and preferably between 7.1 and 7.9.

As the above microwave dielectric ceramic possesses a positive temperature coefficient of resonate frequency, it can also be utilized as a regulator for regulating a temperature coefficient of resonate frequency of a microwave dielectric ceramic. Therefore, it is also another objective of the invention to provide a regulator for regulating a temperature coefficient of resonate frequency of a microwave dielectric ceramic. The regulator comprises the microwave dielectric ceramic as described in the above, which has a chemical formula of $BaSi_xO_{2x+1}$, $1.56 \leq x \leq 1.85$, a relatively low dielectric constant and a positive temperature coefficient of resonate frequency. The dielectric constant is smaller than 8, and preferably between 7.1 and 7.9.

The regulator for regulating the temperature coefficient of resonate frequency of the microwave dielectric ceramic is optionally utilized in preparing a microwave dielectric ceramic material to regulate the temperature coefficient of resonate frequency of the microwave dielectric ceramic material from a negative direction towards a positive direction approaching zero. The "approaching zero" refers to between −10 and +10 ppm/° C. in the technical field.

A method for preparing the regulator for regulating the temperature coefficient of resonate frequency of the microwave dielectric ceramic, comprises the following steps:

1) mixing $BaCO_3$ with $SiO_2$ according to a certain molar ratio to yield a mixture, performing wet ball-milling on the mixture, drying a slurry, and pre-sintering a dried product at 1100° C. for 3 hrs to yield a calcined ceramic powder; and
2) performing wet ball-milling on the calcined ceramic powder obtained from 1), adding an adhesive to a dried product, granulating, tabletting the dried product to form green samples, and sintering the green samples at between 1150 and 1250° C. in the presence of air or reducing gas to yield the regulator for regulating the temperature coefficient of resonate frequency of the microwave dielectric ceramic.

In the preparation process of the microwave dielectric ceramic or the regulator for regulating the temperature coefficient of resonate frequency of the microwave dielectric ceramic, either the sintering is carried out in the presence of the air or in the presence of the reducing gas (for instance, $N_2$–1 vol % $H_2$), the regulator as the product possesses excellent microwave dielectric characteristics, which demonstrates the excellent anti-reductive property of the regulator.

In the above wet ball-milling process, a dispersant is preferably a deionized water. The use of the deionized water as the dispersant make the dispersion more uniform during the preparation of the ceramic and the structure of the ceramic more compact. But when adopting the alcohol as the dispersant as the conventional method, the dispersion effect is not as good as the use of the deionized water. The use of the alcohol as the dispersant possibly results in that a second phase is produced due to the non-fully reacted carbonates powder and the produced carbon dioxide may lead to production of micro-pores therefore reducing the microwave performance of the materials.

When the microwave dielectric ceramic is applied to prepare a multi-layer ceramic capacitor (MLCC), a base metal electrode-MLCC (BME-MLCC) can be prepared, and the microwave dielectric performance will not be affected by the sintering process in the presence of the reducing gas. The regulator has a positive temperature coefficient of resonate frequency and excellent anti-reductive property, therefore it is capable of substituting the conventional Ti-based regulator; in addition, the sintering process in the presence of the reducing gas does not result in semiconducting of device, compared with the conventional regulator, the regulator of the invention has obvious advantages and is therefore a new regulator applicable to the BME-MLCC.

As possessing low dielectric constant and positive temperature coefficient of resonate frequency, the above microwave dielectric ceramic can be utilized as a regulator for regulating the frequency-temperature characteristic of microwave dielectric ceramics, which is used to prepare the microwave dielectric ceramic material. The temperature coefficient of resonate frequency of the microwave dielectric ceramic material is regulated to make the microwave dielectric ceramic possess the temperature coefficient of resonate frequency of approaching zero.

It is another objective of the invention to provide a microwave dielectric ceramic material prepared by LTCC process with low dielectric constant, approaching zero temperature coefficient $\tau_f$ of resonate frequency, and excellent microwave dielectric performance, and a method for preparing the same. The microwave dielectric ceramic material and the preparation thereof are taken as examples to demonstrate the regulating function of the regulator for regulating frequency-temperature characteristics of the microwave dielectric ceramic.

The LTCC material comprises: a main crystal phase of the LTCC material, the regulator, and a sintering additive. The main crystal phase of the LTCC microwave dielectric ceramic optionally comprises: barium, aluminum, silicon, and oxygen, for example $BaAl_2Si_2O_8$; the sintering additive is optionally LiF; and a percent by weight of the sintering additive is between 0.5% and 2%, preferably 1%.

Specifically, an LTCC material, for example, has a chemical formula of y wt. % $BaAl_2Si_2O_8$+(99−y) wt. % $BaSi_xO_{1+2}$, +1 wt. % LiF, in which 1.56≤x≤1.85, and 0≤y≤99. The LTCC material comprises: $BaAl_2Si_2O_8$ as the main crystal phase, the regulator, and the sintering additive. A weight ratio of the $BaAl_2Si_2O_8$ as the main crystal phase to the regulator to the sintering additive is y: (99−y): 1, in which 0≤y≤99. The preparation of the LTCC material comprises the following steps:

1) mixing $BaCO_3$, $SiO_2$, and $Al_2O_3$ according to a molar ratio of 1:2:1 to yield a mixture, performing wet ball-milling on the mixture to yield a slurry, drying a slurry, and pre-sintering a dried product at between 1100° C. and 1200° C. for between 2 and 4 hrs to yield a calcined ceramic powder; and microwave dielectric performance, and approaching zero $\tau_f$ value. Specific data are listed in Examples 7-11.

The regulator for regulating frequency-temperature characteristics of the microwave dielectric ceramic prepared by the invention has the low dielectric constant, as well as the positive $\tau_f$ value and the excellent anti-reductive performance. The low dielectric constant is beneficial to improve the fabrication precision of the microwave MLCC, the abnormal positive $\tau_f$ value can be utilized as the regulator for regulating the temperature coefficient of resonate frequency of microwave dielectric ceramics, thus being helpful to overcome the restraint of the Ti-based additive and particularly applicable to the BEM-MLCC field.

Examples 1-6

A microwave dielectric ceramic was prepared as follows:

1) Analytical reagents $BaCO_3$ and $SiO_2$ were collected according to a ratio of molar percentage as shown in Table 1 were mixed. A mixture was added with spherical zinconia as a medium and a deionized water as a dispersant, then mixed and stirred by a ball mill for 3 hrs at a rotational speed of 360 rpm to yield a slurry. The slurry was then dried at 1100° C. for 3 hrs to yield a calcined ceramic powder.

2) The calcined ceramic powder obtained in 1) was treated by the wet ball-milling again, and a slurry was dried and added with a 3 wt. % polyvinyl alcohol (PVA) for granulation. Granules were pressed at a pressure of 100 megapascal to form cylindrical green samples having a ratio of a thickness to a diameter of between 0.4 and 0.6. Thereafter, the cylindrical green samples were sintered in the presence of air or reducing gas at between 1150 and 1250° C. to yield the microwave dielectric ceramic or the regulator for regulating the frequency-temperature characteristics as listed in Table 1.

TABLE 1

Components, sintering atmosphere, sintering temperature, and microwave dielectric performance of Examples 1-6

| Example | Mole percentage (%) BaCO₃ | SiO₂ | x | Sintering atmosphere | Sintering temperature | Dielectric constant | Q × f (GHz) | $\tau_f$ (ppm/° C.) |
|---|---|---|---|---|---|---|---|---|
| 1 | 38 | 62 | 1.63 | Air | 1150° C. | 7.1 | 17400 | +37.2 |
| 2 | 35 | 65 | 1.85 | Air | 1250° C. | 7.5 | 20350 | +1.7 |
| 3 | 39 | 61 | 1.56 | Air | 1250° C. | 7.6 | 16694 | +24.8 |
| 4 | 38 | 62 | 1.63 | N₂-1 vol % H₂ | 1150° C. | 7.5 | 10973 | +14.3 |
| 5 | 35 | 65 | 1.85 | N₂-1 vol % H₂ | 1250° C. | 7.9 | 15141 | +15.5 |
| 6 | 39 | 61 | 1.56 | N₂-1 vol % H₂ | 1250° C. | 7.6 | 11734 | +14.3 |

2) mixing the calcined ceramic powder obtained in 1), $BaSi_xO_{2x+1}$, in which 1.56≤x≤1.85, as the regulator of the microwave dielectric ceramic of one of Examples 1-6, and the sintering additive, in which, the sintering additive is preferably LiF, according to a weight ratio of y: (99−y): 1, in which 0≤y≤99, to yield a mixture; performing wet ball-milling on the mixture, drying a slurry, adding an adhesive to a dried product for granulation, preforming granules to form green samples, and sintering the green samples at between 750° C. and 950° C. to yield the LTCC material.

The dispersant utilized in the wet ball-milling process is preferably deionized water.

The sintering temperature of the LTCC material prepared by the above method is reduced to below 950° C. And the LTCC material possesses low dielectric constant, excellent cIt was known from Table 1 that the microwave dielectric ceramics prepared in Examples 1-6 possess excellent microwave dielectric performance, the dielectric constant is between 7.1 and 7.9, $\tau_f$ values are all positive, thus can be used as a regulator for regulating the frequency-temperature characteristics which is used to regulate a temperature coefficient of resonate frequency to near zero in preparation of the microwave dielectric ceramic material. In the meanwhile, it was known from Examples 4-6 that the microwave dielectric ceramic still possesses excellent microwave dielectric performance after being sintered in the atmosphere of N₂−1 vol % H₂, which indicated that the regulator has excellent anti-reductive property.

The microwave dielectric ceramic provided by the invention as the chemical formula of $BaSi_xO_{2x+1}$, in which the value of x does not conform with any rules, and the range of the value of x is non-obvious. It was found from extensive trails that when x is equal to 1 or 2, the temperature coefficient of the resonate frequency is negative, and the microwave dielectric ceramic cannot be used as the regulator for regulating the frequency-temperature characteristics. It was demonstrated that an advisable range of x is $1.56 \leq x \leq 1.85$.

Examples 7-11

An LTCC material was prepared as follows:
1) $BaCO_3$, $Al_2O_3$, and $SiO_2$ were collected according to a stoichiometry ratio of the chemical formula of $BaAl_2Si_2O_8$ and mixed. A mixture was added with spherical zinconia as a medium and a deionized water as a dispersant, then mixed and stirred by a ball mill for 3 hrs at a rotational speed of 360 rpm to yield a slurry. The slurry was then dried at 1200° C. for 3 hrs to yield a calcined ceramic powder.
2) The calcined ceramic powder obtained in 1), the regulator for regulating the frequency-temperature characteristics of the microwave dielectric ceramic of Examples 1-6, and the sintering additive which is preferably LiF, are mixed according to a weight ratio of y: (99−y): 1, then treated by the wet ball-milling again. A slurry was dried and added with a 3 wt. % polyvinyl alcohol (PVA) for granulation. Granules were pressed at a pressure of 100 megapascal to form cylindrical green samples having a ratio of a thickness to a diameter of between 0.4 and 0.6.
3) The cylindrical green samples were separated from organic substances at 550° C., then heated to the sintering temperatures as listed in Table 2 at a heating rate of 5° C./min, and sintered in the air for 3 hrs. After final products were cooled to the room temperature in the furnace, the LTCC material as listed in Table 2 were obtained.

TABLE 2

Components, sintering temperature, and microwave dielectric performance of Examples 7-11

| Example | x | y | Sintering temperature | Dielectric constant | Q × f (GHz) | $\tau_f$ (ppm/° C.) |
|---|---|---|---|---|---|---|
| 7 | 1.63 | 0 | 950 | 8.0 | 14285 | +19.1 |
| 8 | 1.56 | 40 | 950 | 8.03 | 13162 | +1.4 |
| 9 | 1.56 | 50 | 750 | 7.54 | 16385 | −9.17 |
| 10 | 1.56 | 60 | 750 | 7.12 | 19632 | −16.4 |
| 11 | 1.56 | 99 | 750 | 6.81 | 47029 | −28.7 |

In Examples 7-11, the regulator for regulating the frequency-temperature characteristics of the microwave dielectric ceramic was used to prepare the LTCC material. As shown in Table 2, the sintering temperatures in Examples 7-11 were all lower than 950° C., which satisfied the requirements of the LTCC process. It was known from Examples 7-11 that with the addition of the regulator for regulating the frequency-temperature characteristics (reduction of y), the value of $\tau_f$ was regulated from −28.7 ppm/° C. to +19.1 ppm/° C., which demonstrated that the regulator for regulating the frequency-temperature characteristics possesses the function of regulating the value of $\tau_f$. In Example 8, the value of $\tau_f$ approaches zero (+1.4 ppm/° C.), and in Example 11, a value of Q×f is maximum (Q×f=47029 GHz).

Unless otherwise indicated, the numerical ranges involved in the invention include the end values. While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:
1. A microwave dielectric ceramic, comprising a main crystal phase having a chemical formula of $BaSi_xO_{2x+1}$, wherein $1.56 \leq x \leq 1.85$.
2. The microwave dielectric ceramic of claim 1, wherein the microwave dielectric ceramic has a dielectric constant of smaller than 8 and a positive temperature coefficient of resonate frequency.
3. The microwave dielectric ceramic of claim 2, wherein the dielectric constant of the microwave dielectric ceramic is between 7.1 and 7.9.
4. A regulator for regulating frequency-temperature characteristics of microwave dielectric ceramics, the regulator comprising a microwave dielectric ceramic comprising a main crystal phase having a chemical formula of $BaSi_xO_{2x+1}$, $1.56 \leq x \leq 1.85$; wherein a dielectric constant of the microwave dielectric ceramic is smaller than 8, a temperature coefficient of resonate frequency of the microwave dielectric ceramic is positive.
5. The regulator of claim 4, wherein the dielectric constant of the microwave dielectric ceramic is between 7.1 and 7.9.
6. A low temperature co-fired ceramic material, comprising: a main crystal phase, the regulator of claim 4, and between 0.5 and 2 percent by weight of a sintering additive; the main crystal phase comprising: barium, aluminum, silicon, and oxygen.
7. The ceramic material of claim 6, wherein the main crystal phase of the low temperature co-fired ceramic material is $BaAl_2Si_2O_8$.
8. The ceramic material of claim 6, wherein the sintering additive is LiF.
9. The ceramic material of claim 6, wherein the content of the sintering additive is 1 percent by weight.
10. The ceramic material of claim 6, wherein a chemical formula of the low temperature co-fired ceramic material is y wt. % $BaAl_2Si_2O_8$+(99−y) wt. % $BaSi_xO_{1+2x}$+1 wt. % LiF, in which $1.56 \leq x \leq 1.85$, and $0<y<99$.
11. The ceramic material of claim 10, wherein the dielectric constant of the microwave dielectric ceramic is between 7.1 and 7.9.
12. A method for preparing a low temperature co-fired ceramic microwave ceramic material, the method comprising:
1) weighing and mixing $BaCO_3$, $Al_2O_3$, $SiO_2$ according to a stoichiometry ratio of a chemical formula $BaAl_2Si_2O_8$ to yield a mixture, performing wet ball-milling on the mixture to yield a slurry, drying the slurry, and calcining a dried product at a temperature of between 1100 and 1200° C. for between 2 and 4 hrs to yield a calcined ceramic powder; and
2) mixing the calcined ceramic powder obtained from 1), the regulator of claim 4, and a sintering additive according to a weight ratio of y: (99−y): 1, in which, $0<y<99$, to yield a mixture; performing wet ball-milling on the mixture to yield a slurry, drying the slurry, adding an adhesive to a dried product, granulating, tabletting the dried product to form green samples; sintering the green samples at between 750° C. and 950° C. to yield a low temperature co-fired ceramic microwave ceramic material.
13. The method of claim 12, wherein the sintering additive is LiF.

14. The method of claim 12, wherein deionized water is used as a dispersant in wet ball-milling processes of 1) and 2).

15. The method of claim 12, wherein a dielectric constant of the microwave dielectric ceramic is between 7.1 and 7.9.

* * * * *